(12) United States Patent
Jao et al.

(10) Patent No.: US 7,026,234 B2
(45) Date of Patent: Apr. 11, 2006

(54) PARASITIC CAPACITANCE-PREVENTING DUMMY SOLDER BUMP STRUCTURE AND METHOD OF MAKING THE SAME

(75) Inventors: Jui-Meng Jao, Miao-Li Hsien (TW); Shing-Ren Sheu, Tao-Yuan (TW); Kuo-Ming Chen, Hsin-Chu Hsien (TW); Hung-Min Liu, Hsin-Chu (TW); Kun-Chih Wang, Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 57 days.

(21) Appl. No.: 10/709,940

(22) Filed: Jun. 8, 2004

(65) Prior Publication Data

US 2004/0266160 A1    Dec. 30, 2004

(51) Int. Cl.
*H01L 21/44* (2006.01)
*H01L 29/40* (2006.01)

(52) U.S. Cl. ............ 438/613; 438/612; 438/614; 438/622; 438/623; 438/624; 438/626; 257/707; 257/737; 257/738; 257/778; 257/780; 257/758

(58) Field of Classification Search ........... 438/613, 438/614, 622, 623, 624, 626, 612; 257/758, 257/707, 737, 738, 778, 780

See application file for complete search history.

(56) References Cited

U.S. PATENT DOCUMENTS

| | | | | |
|---|---|---|---|---|
| 5,220,199 A | * | 6/1993 | Owada et al. | 257/773 |
| 6,118,180 A | * | 9/2000 | Loo et al. | 257/737 |
| 6,333,557 B1 | * | 12/2001 | Sullivan | 257/758 |
| 6,551,856 B1 | * | 4/2003 | Lee | 438/108 |
| 6,759,319 B1 | * | 7/2004 | Viswanadam et al. | 438/613 |
| 6,847,066 B1 | * | 1/2005 | Tahara et al. | 257/243 |
| 6,913,946 B1 | * | 7/2005 | Lin | 438/106 |
| 2004/0178436 A1 | * | 9/2004 | Baniecki et al. | 257/310 |
| 2004/0183187 A1 | * | 9/2004 | Yamasaki et al. | 257/700 |

FOREIGN PATENT DOCUMENTS

JP        2003017530 A  *  1/2003

* cited by examiner

*Primary Examiner*—B. William Baumeister
*Assistant Examiner*—Igwe U. Anya
(74) *Attorney, Agent, or Firm*—Winston Hsu

(57) ABSTRACT

A parasitic capacitance-preventing dummy solder bump structure on a substrate has at least one conductive layer formed on the substrate, a dielectric layer employed to cover the conductive layer, an under bump metallurgy layer (UBM layer) formed on the dielectric layer, and a solder bump formed on the UBM layer.

17 Claims, 9 Drawing Sheets

PARASITIC CAPACITANCE-PREVENTING DUMMY SOLDER BUMP STRUCTURE AND METHOD OF MAKING THE SAME

BACKGROUND OF INVENTION

1. Field of the Invention

The present invention relates to a method of forming a solder bump structure, and more specifically, to a method of forming a parasitic capacitance-preventing dummy solder bump structure.

2. Description of the Prior Art

High performance microelectronic devices often use solder balls or solder bumps for electrically and mechanically interconnection to other microelectronic devices. For instance, a very large scale integration (VLSI) chip may be electrically connected to a circuit board or other next level packaging substrate by using solder balls or solder bumps. This connection technology is also referred to as "Controlled Collapse Chip Connection (C4)" or "flip chip" technology. The flip chip technology is an area array connection technology and includes reflowing a body of solder onto a bond pad to form a solder bump, so as to electrically connect an IC die to a packaging board.

Please refer to FIG. 1 to FIG. 4 of schematic views of forming a solder bump according to the prior art. As shown in FIG. 1, a surface of a substrate 10 comprises a first area 12 and a second area 14, and at least one conductive layer 16 is positioned on the surface of the substrate 10. Normally, the substrate 10 is a semiconductor wafer with circuits formed inside the semiconductor wafer, and the first area 12 and the second area 14 are respectively a central area and a border area of the surface of the substrate 10.

As shown in FIG. 2, a chemical vapor deposition (CVD) process is performed to form a dielectric layer 18 on the substrate 10 to cover the conductive layer 16. An etching process is then performed to form at least one via hole 20 in portions of the dielectric layer 18 within the first area 12 down to a surface of the conductive layer 16. By performing a deposition process, a via plug 22, comprising tungsten, is formed in each via hole 20. A chemical mechanical polishing (CMP) process is performed thereafter to make a top surface of the via plug 22 approximately aligned with a top surface of the dielectric layer 18.

As shown in FIG. 3, a metal pad 24, comprising either copper or aluminum, is formed within each of a plurality of predetermined regions within the first area 12 and the second area 14. A CVD process and an etching process are then performed to form a passivation layer 26 on portions of the dielectric layer 18 not covered by the metal pad 24. As shown in FIG. 4, an under bump metallurgy (UBM) layer 28 is formed on each metal pad 24 by performing a sputtering process and an etching process. Finally, a solder bump 30 is formed on each UBM layer 28. Wherein portions of the solder bumps 30 formed within the second area are employ as dummy solder bumps to make the layout of the solder bumps 30 on the surface of the substrate 10 symmetrical, so as to improve the fluidity of an underfill liquid compound in subsequent packaging processes.

However, as technology progresses, the process line width of semiconductor manufacturing decreases as well. Parasitic capacitance therefore occurs between the metal pad 24 and the conductive layer 16 due to the shortened distance between the metal pad 24 and the conductive layer as the thickness of the dielectric layer 18 is narrowed, leading to the defective electrical performance or even circuit fail of the device.

SUMMARY OF INVENTION

It is therefore a primary object of the present invention to provide a method of the forming a parasitic capacitance-preventing dummy solder bump structure so as to assure the electrical performance of a semiconductor device.

According to the claimed invention, a surface of a substrate comprises a first area and a second area, and at least one conductive layer is formed on the surface of the substrate. At the beginning of the method, a chemical vapor deposition (CVD) process is performed to form a dielectric layer on the substrate to cover the conductive layer. At least one via plug is then formed in portions of the dielectric layer within the first area down to a surface of the conductive layer. At least one metal pad electrically connected to the via plug is formed thereafter. By performing an UBM process, at least one UBM layer is formed to cover both the metal pad within the first area and portions of the dielectric layer within the second area. Finally, a solder bump is formed on the UBM layer. Wherein the solder bump formed within the second area is employed as a dummy solder bump to improve the fluidity of an underfill liquid compound in subsequent packaging processes.

It is an advantage of the present invention against the prior art that the dummy solder bump in the present invention is formed on the UBM layer positioned on the dielectric layer, so that the metal pad between the UBM layer and the dielectric layer according to the prior art is neglected. The parasitic capacitance occurred between the metal pad under the dummy solder bump and the neighboring metal wire as described in the prior art is prevented. Consequently, the fluidity of an underfill liquid compound in subsequent packaging processes is significantly improved without reducing the electrical performance of the device, and the manufacturing yield rate is increased as well.

These and other objectives of the present invention will no doubt become obvious to those of ordinary skill in the art after reading the following detailed description of the preferred embodiment, which is illustrated in the multiple figures and drawings.

DETAILED DESCRIPTION

Figure 1:
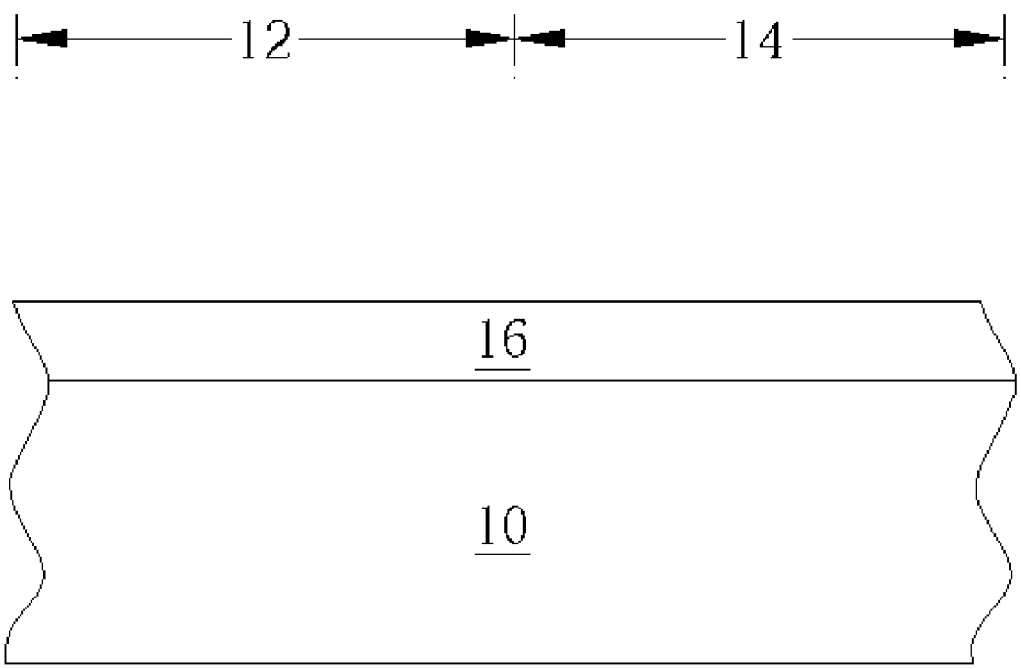
FIG. 1 to FIG. 4 are schematic views of forming a solder bump according to the prior art.
Figure 2:
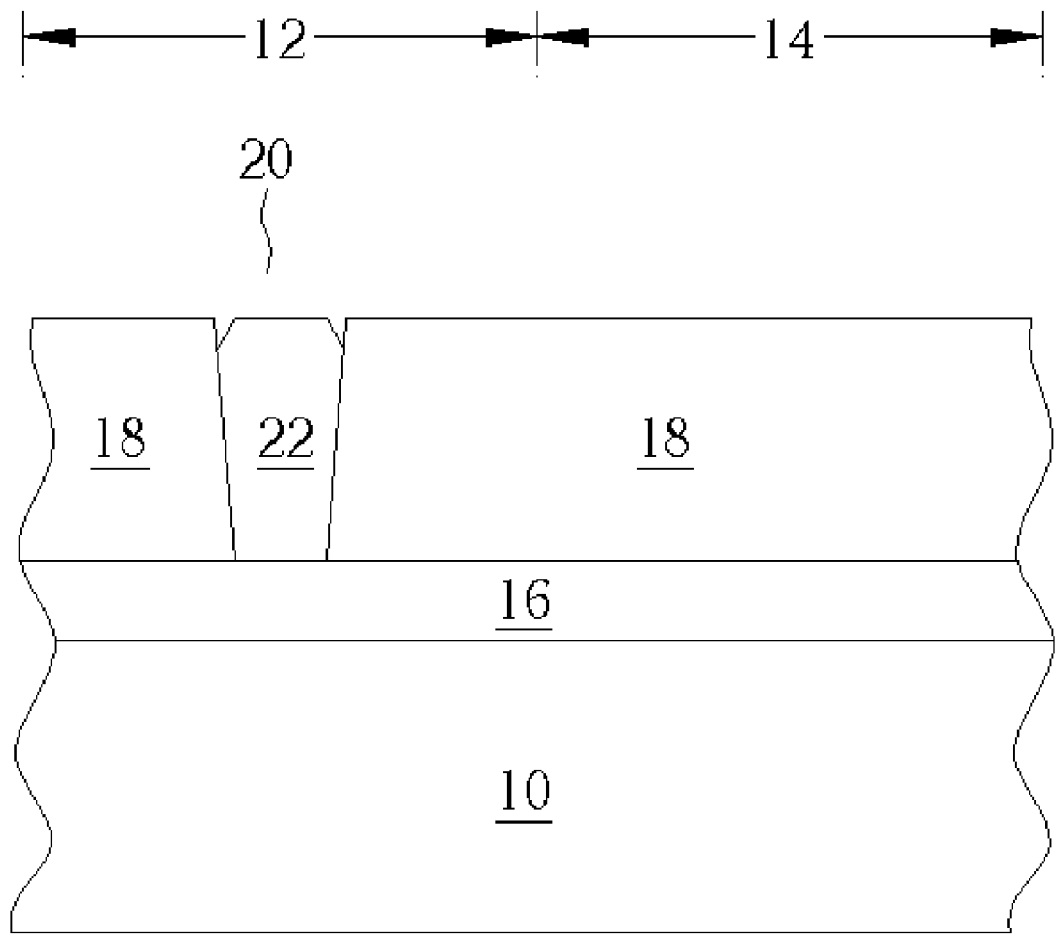
Figure 3:
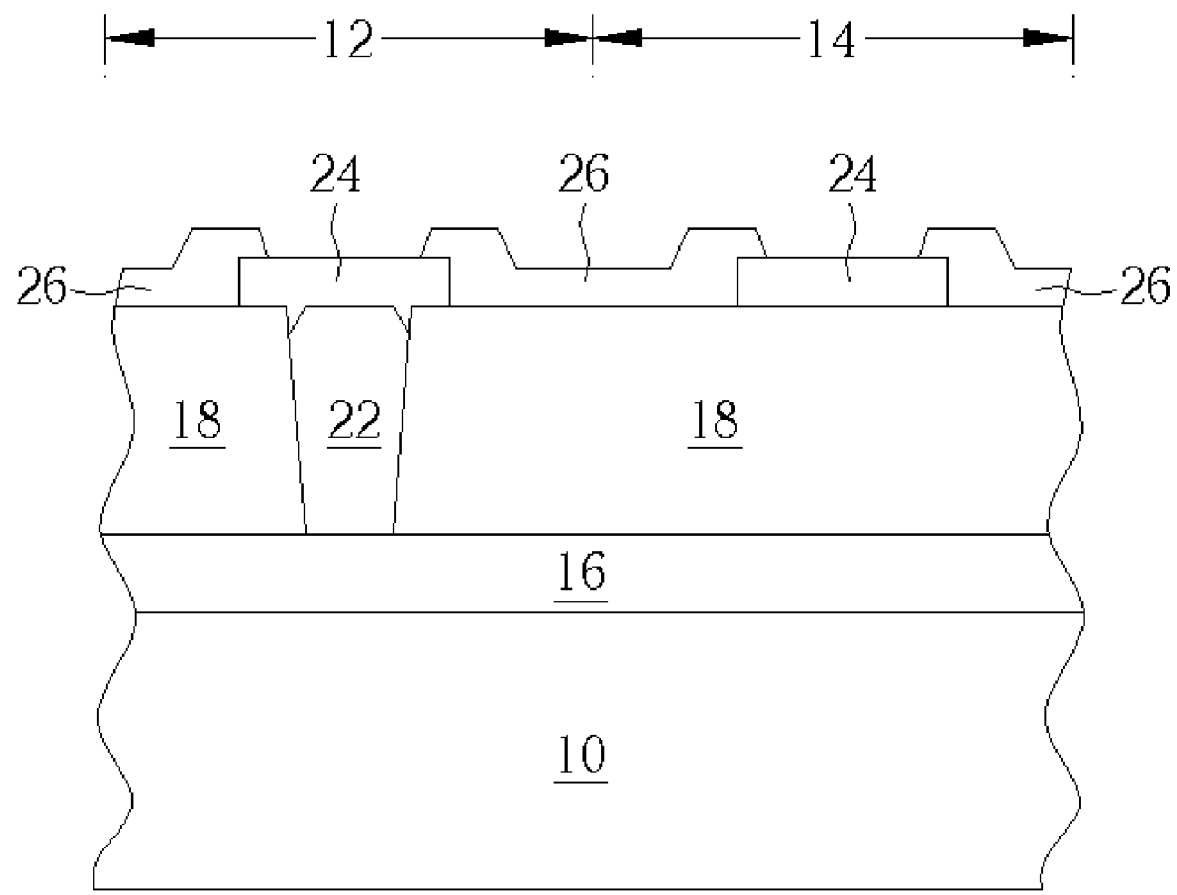
Figure 4:
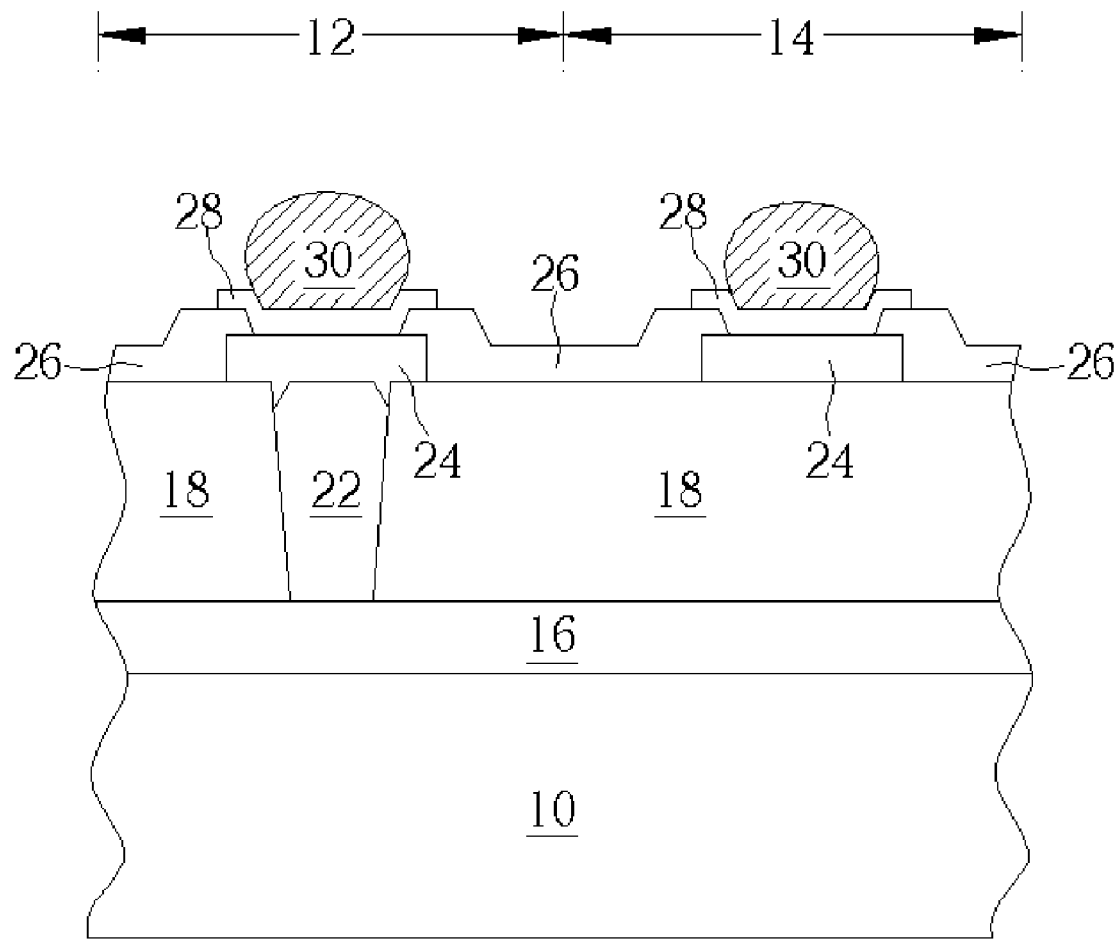
Figure 5:
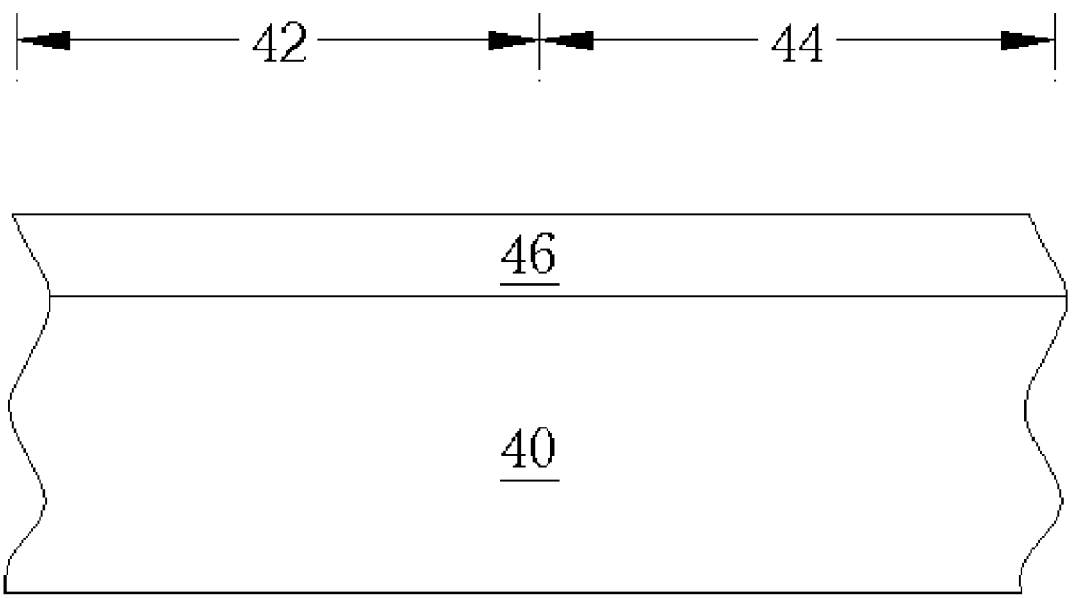
FIG. 5 to FIG. 9 are schematic views of forming a parasitic capacitance-preventing dummy solder bump structure according to the present invention.

Please refer to FIG. 5 to FIG. 9 of schematic views of forming a parasitic capacitance-preventing dummy solder bump structure according to the present invention. As shown in FIG. 5, a substrate 40 comprises at least patterned conductive layer 46 positioned on a surface of the substrate 40. The surface of the substrate 40 comprises a first area 42 and a second area 44. Normally, the substrate 40 is a semiconductor wafer with circuits formed inside the semiconductor wafer, and the first area 42 and the second area 44 are respectively a central area and a border area of the surface of the substrate 40.

Figure 6:
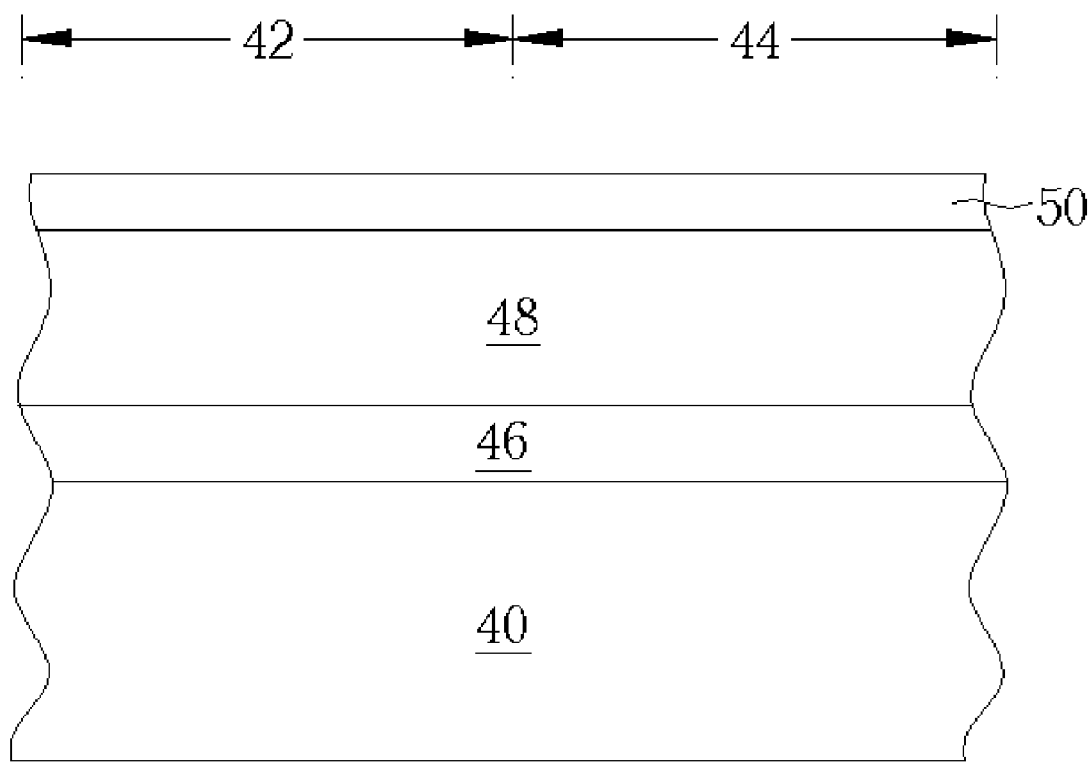

As shown in FIG. 6, a chemical vapor deposition (CVD) process is performed to form a dielectric layer 48, comprising either silicon nitride or silicon oxide, on the substrate 40 to cover the conductive layer 46. A passivation layer 50, comprising either silicon nitride or silicon oxide, is formed thereafter on the dielectric layer 48. Alternatively, in another embodiment of the present invention, the dielectric layer 48, comprising either silicon nitride or silicon oxide, is formed to cover the conductive layer 48 without the passivation layer 50 subsequently formed on the dielectric layer.

Figure 7:
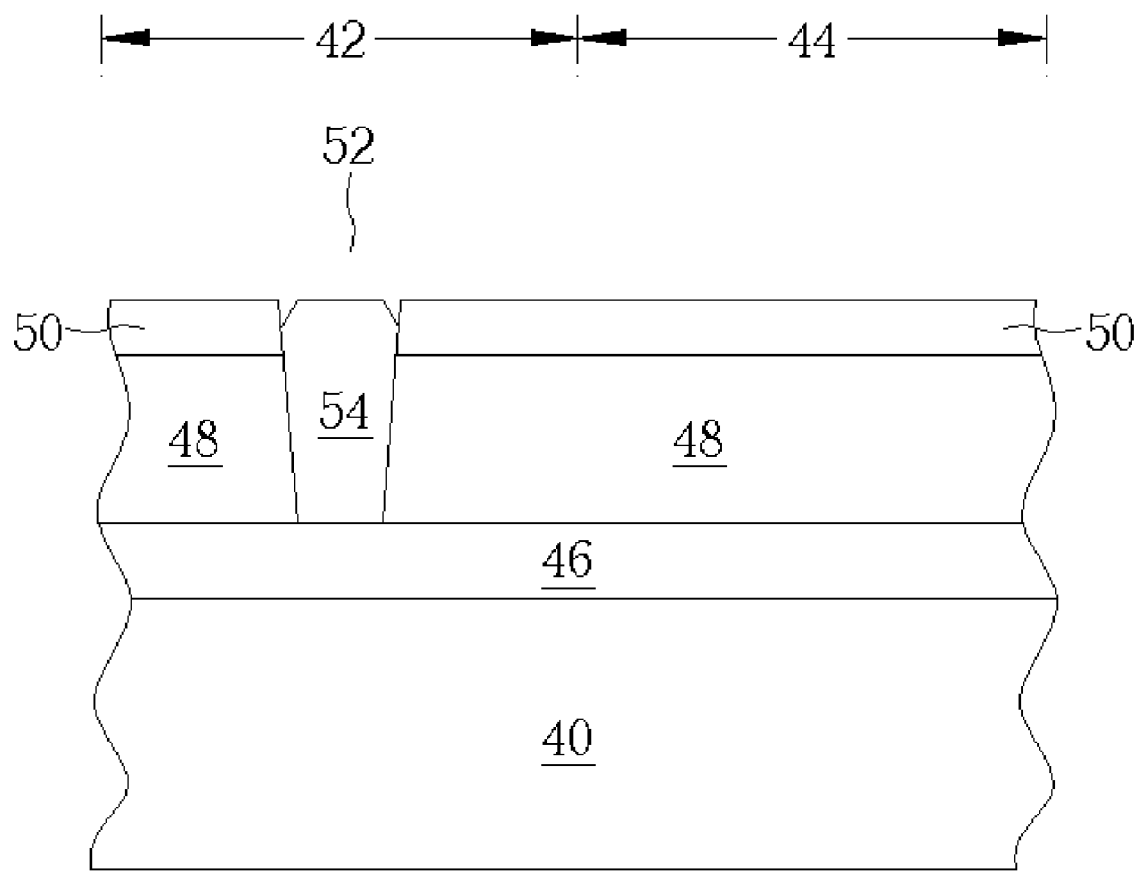

As shown in FIG. 7, an etching process is performed to form at least one via hole 52 in portions of the dielectric layer 48 within the first area 42 down to a top surface of the conductive layer 48. A via plug 54 is then formed to fill each via hole 52 by performing a deposition process. Normally, the via plug 54 comprises either one of titanium (Ti), titanium nitride (TiN), tungsten (W), aluminum (Al), copper (Cu) or copper-aluminum alloy (Cu—Al alloy), and is alternatively formed by a sputtering process.

Figure 8:
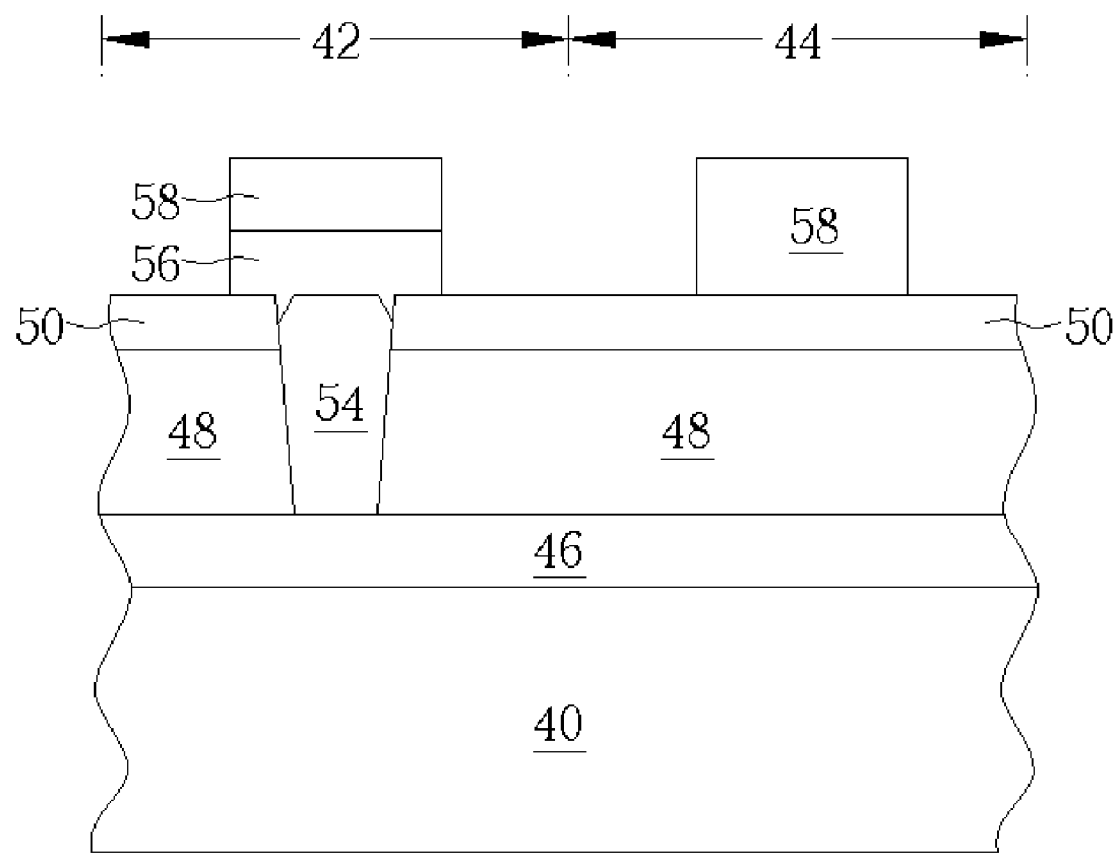

As shown in FIG. 8, at least one metal pad 56 electrically connected to the via plug 54 is formed, and a sputtering process and an etching process are performed to form at least one under bump metallurgy layer (UBM layer) 58 to cover both the metal pad 56 within the first area 42 and portions of the passivation layer 50 within the second area 44.

Figure 9:
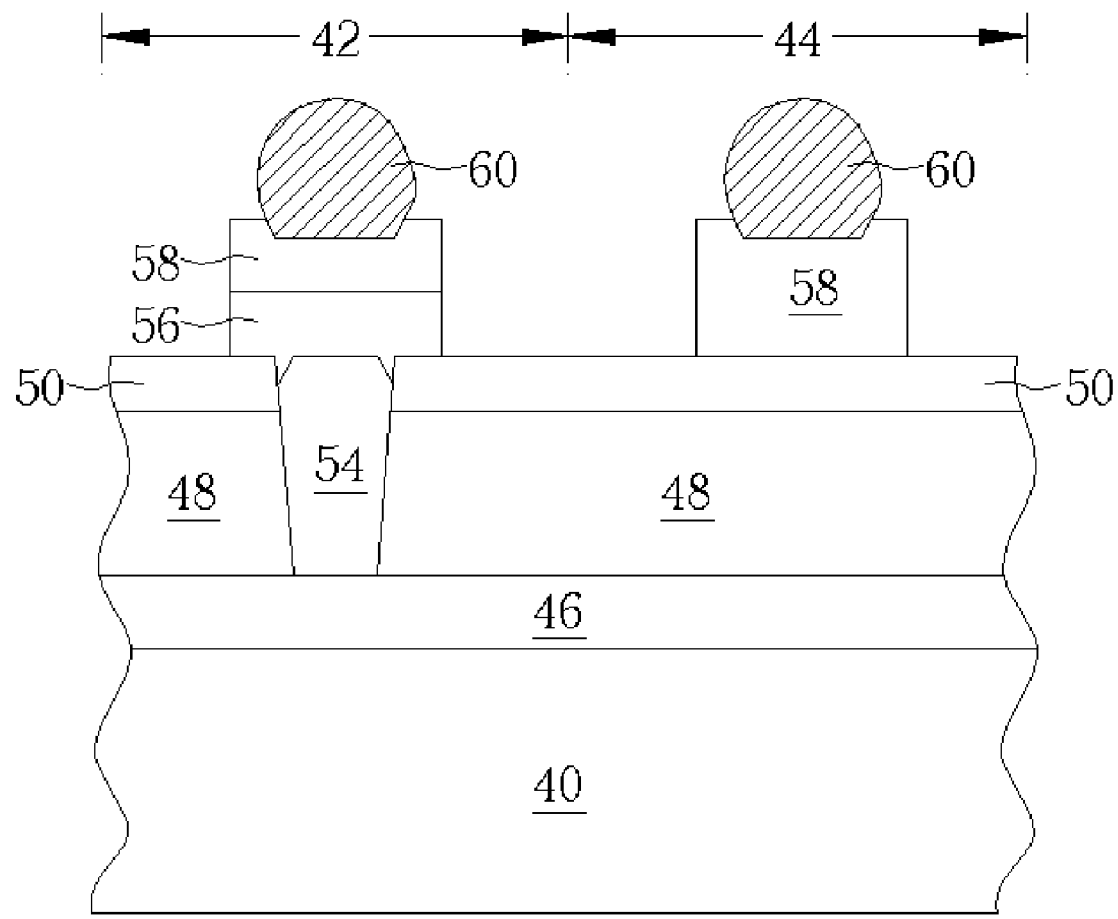

Finally, as shown in FIG. 9, a solder bump 60 is formed on each UBM layer 58 at the end of the method. Wherein the solder bump 60 formed within the second area 44 is employed as a dummy solder bump to make the layout of the surface of the substrate 40 symmetrical, so as to improve the fluidity of an underfill liquid compound in subsequent packaging processes.

It is emphasized that the metal pad 56 formed on the via plug 54 is employed to reinforce the adhesion between the UBM layer 58 and the via plug 54, so that no metal pad 56 is formed within the second area 44. In another embodiment of the present invention, the metal pad 56, under either the solder bump 60 within the first area 42 or the dummy solder bump 60 within the second area 44, is neglected.

In comparison with the prior, the present invention reveal a method of forming the solder bump 60 on the UBM layer 58 after performing a sputtering process to form the UBM layer 58 on either the metal pad 56 within the first area 42 or the passivation layer 50 within the second area 44, so as to use the solder bump 60 within the second area 44 as a dummy solder bump to make the layout of the surface of the substrate 40 symmetrical. Therefore, the fluidity of an underfill liquid compound in subsequent packaging processes is significantly improved. As the thickness of the dielectric layer 48 decreases due to the narrowed process line width, the parasitic capacitance occurred between the metal pad under the dummy solder bump and the neighboring metal wires as described in the prior art is prevented. Consequently, the fluidity of an underfill liquid compound in subsequent packaging processes is improved without reducing the electrical performance of the device.

Those skilled in the art will readily observe that numerous modifications and alterations of the device may be made while retaining the teachings of the invention. Accordingly, the above disclosure should be construed as limited only by the metes and bound of the appended claims.

What is claimed is:

1. A parasitic capacitance-preventing dummy solder bump structure, the dummy solder bump structure being formed on a substrate, the dummy solder bump structure comprising:

at least one conductive layer formed on the substrate;

a dielectric layer formed on the substrate to cover the conductive layer;

a passivation layer formed on the dielectric layer to completely cover the dielectric layer;

an under bump metallurgy layer (UBM layer) directly formed on the surface of the passivation layer without a metal pad there in between; and a solder bump formed on the UBM layer.

2. The dummy solder bump structure of claim 1 wherein the substrate is a semiconductor wafer with circuits formed inside the semiconductor wafer, and the passivation layer is formed by a chemical vapor deposition (CVD) process.

3. The dummy solder bump structure of claim 1 wherein the dielectric layer and the passivation layer comprise either silicon nitride or silicon oxide.

4. The dummy solder bump structure of claim 1 wherein the UBM layer is a metal layer formed by a sputtering process.

5. The dummy solder bump structure of claim 1 wherein a plurality of solder bump structures is formed on the passivation layer.

6. The dummy solder bump structure of claim 5 wherein each of the solder bump structures comprises:

a metal pad formed on the passivation layer;

an UBM layer formed on the metal pad; and a solder bump formed on the UBM layer.

7. The dummy solder bump structure of claim 6 wherein each of the solder bump structures comprises at least one via plug for electrically connecting the solder bump structure with a corresponding portion of the conductive layer below the solder bump structure.

8. The dummy solder bump structure of claim 5 wherein the solder bump structure is positioned in a central area of a surface of the substrate, and the dummy solder bump structures are positioned in a border area of the surface of the substrate to surround at least one of the solder bump structures.

9. The dummy solder bump structure of claim 1 wherein the dummy solder bump structure is employed to improve the fluidity of an underfill liquid compound in subsequent packaging processes.

10. The dummy solder bump structure of claim 1 wherein the UBM layer dose not contact with the conductive layer.

11. A method of forming a solder bump on a substrate, the substrate comprising at least one conductive layer positioned on a surface of the substrate, the surface of the substrate comprising a first area and a second area, the method comprising:

performing a CVD process to form a dielectric layer on the substrate to cover the conductive layer;

forming a passivation layer on the surface of the dielectric layer to completely cover the dielectric layer;

forming at least one via plug only in portions of the dielectric layer and the passivation layer within the first area down to a surface of the conductive layer;

forming at least one metal pad only in portions of the passivation layer within the first area, the metal pad being electrically connected to the via plug;

performing an UBM process to form at least one UBM layer on the metal pad within the first area and at least one UBM layer directly on the surface of the passivation layer without a metal pad there in between within the second area; and forming a solder bump on each of the UBM layers.

12. The method of claim 11 wherein the dielectric layer and the passivation layer comprise either silicon nitride or silicon oxide.

13. The method of claim 11 wherein the via plug comprises either one of titanium (Ti), titanium nitride (TiN), tungsten (W), aluminum (Al), copper (Cu) or copper-aluminum alloy (Cu—Al alloy).

14. The method of claim 11 wherein the UBM layer is formed by performing a sputtering process.

15. The method of claim 11 wherein the solder bump formed within the second area is employed as a dummy solder bump to improve the fluidity of an underfill liquid compound in subsequent packaging processes.

16. The method of claim 11 wherein the substrate is a semiconductor wafer with circuits formed inside the semiconductor wafer.

17. The method of claim 11 wherein the first area and the second area are respectively a central area and a border area of the surface of the substrate.

* * * * *

UNITED STATES PATENT AND TRADEMARK OFFICE
CERTIFICATE OF CORRECTION

| | |
|---|---|
| PATENT NO. | : 7,026,234 B2 |
| APPLICATION NO. | : 10/709940 |
| DATED | : April 11, 2006 |
| INVENTOR(S) | : Jui-Meng Jao et al. |

It is certified that error appears in the above-identified patent and that said Letters Patent is hereby corrected as shown below:

<u>Title page,</u>
Item [30], insert:
-- [30] Foreign Application Priority Data
June 26, 2003   [TW] Taiwan....................................092117491 --.

Signed and Sealed this

Twenty-seventh Day of June, 2006

JON W. DUDAS
*Director of the United States Patent and Trademark Office*